United States Patent [19]
Yang

[11] Patent Number: 5,757,083
[45] Date of Patent: May 26, 1998

[54] DRAIN OFF-SET FOR PULL DOWN TRANSISTOR FOR LOW LEAKAGE SRAM'S

[75] Inventor: Ming-Tzong Yang, Hsin Chu, Taiwan

[73] Assignee: United Microelectronics Corporation, Taiwan

[21] Appl. No.: 728,090

[22] Filed: Oct. 9, 1996

Related U.S. Application Data

[63] Continuation of Ser. No. 503,227, Jul. 17, 1995, abandoned, which is a continuation of Ser. No. 97,037, Jul. 27, 1993, abandoned.

[51] Int. Cl.[6] .................................................. H01L 27/11
[52] U.S. Cl. ................................. 257/903; 257/904
[58] Field of Search ........................... 257/900, 369, 257/903, 904

[56] References Cited

U.S. PATENT DOCUMENTS

| | | | |
|---|---|---|---|
| 4,258,378 | 3/1981 | Wall | 257/900 |
| 4,737,828 | 4/1988 | Brown | 257/900 |
| 5,254,866 | 10/1993 | Ogoh | 257/369 |
| 5,317,197 | 5/1994 | Roberts | 257/904 |

OTHER PUBLICATIONS

"A 23–ns4–Mb CMOS SRAM with 0.2–μA Standby Current" by K. Sasaki et al. Pub in IEEE Journal of Solid State Circuits, vol. 25 No. 5 Oct. 1990 pp. 1075–1080.

"A Polysilicon Transistor Technology for Large Capacity SRAM" by S. Ikeda et al. IEDM 90–469–472.

A 5.9 μm$^2$ Super Low Power SRAM Cell Using a New Phase–Shift Lithography by T. Yawauka et al. IEDM 90–477–480.

*Primary Examiner*—Carl W. Whitehead
*Attorney, Agent, or Firm*—Rabin, Champagne, & Lynt, P.C.

[57] ABSTRACT

The pull down transistor of a static SRAM semiconductor device is formed with oxide and polysilicon regions formed on a doped silicon substrate. A masking area is formed over the drain side of the polysilicon and the areas of the drain region proximal to the gate in the silicon and oxide layers below. N+ dopant is implanted into the unmasked areas of said substrate about the polysilicon region with the drain doping offset by the resist overlying the proximal portion of the drain region. A spacer is formed by chemical vapor deposition about the polysilicon region. Next an N– implantation follows with the offset provided by the spacers about the polysilicon region.

11 Claims, 2 Drawing Sheets

DRAIN OFF-SET FOR PULL DOWN TRANSISTOR FOR LOW LEAKAGE SRAM'S

This is a continuation of application Ser. No.08/503,227, filed Jul. 17, 1995 and now abandoned, which was a continuation of application Ser. No. 08/097,037, filed Jul. 27, 1993 and now abandoned.

BACKGROUND OF THE INVENTION

1. Field of the Invention

This invention relates to transistor devices and more particularly to pull-down transistor structures.

2. Description of Related Art

There is a problem of leakage in the drains of pull down transistors in SRAM circuits. There is no drain offset so there is drain induced lowering of barrier potential $\phi_B$ and band-to-band tunnelling for the pull down transistor limits performance. In particular, a large leakage current is caused in a low power Static Random Access Memory (SRAM) cell, especially in cases in which the thickness of the gate is very thin, (that is $\leq$ about 150 Å.) Since an SRAM is designed to retain stored data indefinitely, this is a problem since the leakage will reduce the length of time during which the data can be stored. As the poly resistor and pull down transistor are connected in series, if the pull down leakage current is large relative to the poly resistor, the storage node cannot pull high, so data is lost. If we simply push the poly resistor high (poly resistor resistance is low) then the SRAM cannot operate with low power. Thus, the best solution is to reduce the leakage current of the pull down transistor.

SUMMARY OF THE INVENTION

In accordance with this invention a process forms a pull down transistor of an SRAM semiconductor device. The device and the method of fabrication thereof comprise a) forming a gate structure on a semiconductor substrate of a first conductivity type;

b) forming a mask in an area on the drain side of the polysilicon structure, leaving the remainder of the gate structure as well as the periphery of the substrate unmasked, c) implanting a first dopant into the unmasked areas of the substrate about the gate structure to form source and drain regions with the drain region offset away from the gate structure by the mask, d) forming a spacer about the gate structure, first by chemical vapor deposition of a spacer material and then by employing a subtractive process to remove the spacer material from the surface of polysilicon structure except immediately about the periphery of the polysilicon region, and e) implantation of a second dopant into the outer portion of the source and the drain regions surrounding the spacer.

Preferably the first dopant is N+ and the second dopant is N−.

It is further preferred that the first dopant is an N+ dopant of arsenic (As) implanted at between about 40 keV and about 100 keV, with a concentration of between about 5×E14 cm$^{-2}$ and about 5×E16 cm$^{-2}$.

It is preferred that the second dopant is ion implanted into the outer portion of the source and the drain regions where the spacer does not provide a shield.

It is further preferred that the chemical species of the second dopant is phosphorous (P), implanted at an energy of between about 40 keV and about 80 keV, with a concentration of between about 5×E12 cm$^{-2}$ and about 5×E14 cm$^{-2}$.

Preferably, a silicon oxide spacer is formed before implantation of the second dopant.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
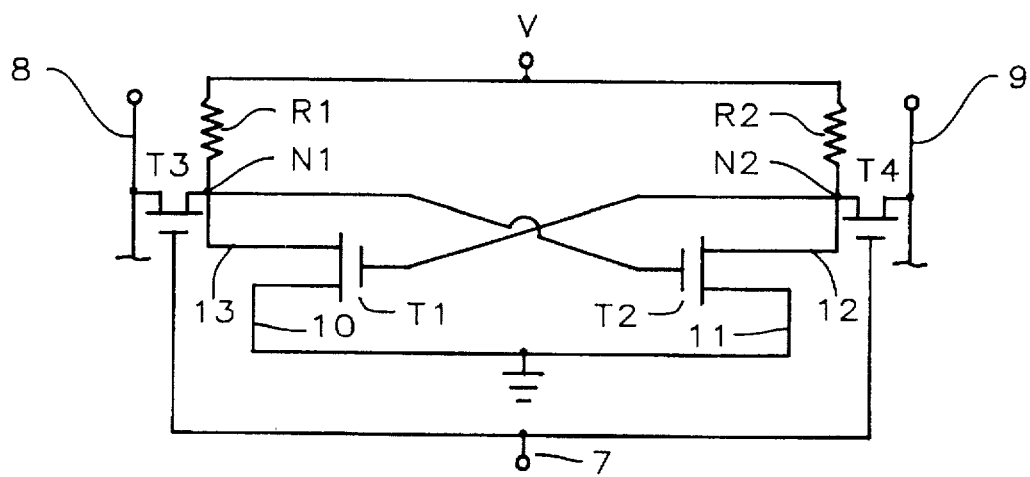
FIG. 1 shows a typical SRAM circuit with a pull down transistor.

FIG. 1 shows a typical prior art SRAM latch circuit with a group of four transistors T1, T2, T3, and T4 with the gates of the transistors T1 and T2 connected in series with the source-drain circuits of transistors T3 and T4 via nodes N2 and N1 respectively. The source drain circuits of transistors T3 and T4 are connected between bitlines 8 and 9 and nodes N1 and N2 respectively. The gates of transistors T3 and T4 are connected to wordline 7. The source and drain of transistor T1 are connected via lines 13 and 10 between node N1 and ground and, as stated above, the gate of transistor T1 is connected to node N2. The source and drain of transistor T2 are connected via lines 12 and 11 between node N2 and ground and, as stated above, the gate of transistor T2 is connected to node N1. Voltage V is connected to resistors R1 and R2 which are connected respectively at their opposite ends to node N1 and node N2. For example, if the wordline 7 is high and T3 and T4 are turned on, the bit line 8 is high and the bitline 9 is low, then T2 is turned on and T1 is turned off. Node N2 is low and node N1 is high. Then, when the wordline 7 is low, T3 and T4 turn off, because node N1 is high and node N2 is low so the remaining pull down transistor T2 is turned on, and T1 is turned off.

Figure 2:
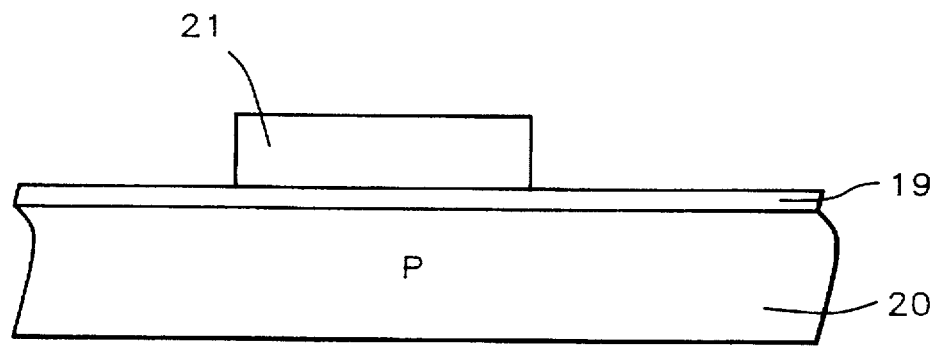
FIGS. 2–6 show a device as it is being formed by means of the process of this invention.

Referring to FIG. 2, the first stage of the process of manufacture of a MOSFET transistor device adapted for use in an SRAM in accordance with this invention is illustrated. A semiconductor substrate 20 of P- type silicon doped with boron by implanting at an energy level between about 30 keV and about 300 keV, with a concentration of between about 1E12 cm$^{-3}$ and about 1E14 cm$^{-3}$. Alternatively, the substrate can be composed of an N− type material and a P well can be formed in the substrate for an N− type device to be made subsequently.

The gate oxide layer 19 composed of SiO$_2$ (which can be grown by passing an oxygen rich gas over the surface of the substrate 20 at a temperature between about 800° C. to about 950° C.) covers the surface of semiconductor substrate 20. To form gate oxide layer 19, an initial stage is to form a LOCOS (Local Oxidation of Silicon) field oxide in accordance with the state of the art. The thickness of gate oxide layer 19 is between about 80 Å thick and about 300 Å thick.

A polysilicon gate structure 21 is formed on top of gate oxide layer 19. Gate structure 21 comprises a heavily doped layer of polysilicon which can be formed by thermal decomposition of silane SiH$_4$ in a reactor between about 575° C. and 650° C. at between about 0.2 Torr and about 1.0 Torr using 100% silane or a diluted mixture of 20–30% silane in nitrogen at about the same pressure, as described in Sze, VLSI Technology, McGraw Hill Book Company pages 238–239 (1988).

Figure 3:
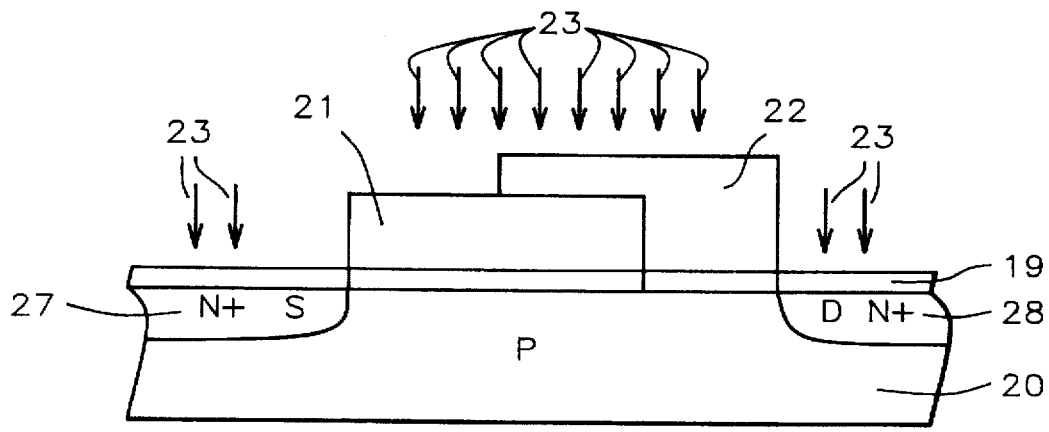

In FIG. 3 the formation of a mask area on the drain side of the polysilicon and implantation of the source region 27 and drain region 28 of the transistor device of FIG. 2 are illustrated. First, a photoresist mask 22 is formed above a portion of at the right side of gate structure 21 extending, as well, over part of the surface of the gate oxide layer 19 and substrate 20 to mask them. Next N+ ions 23 are implanted into the source region 27 and the drain region 28. Drain region 28 is offset to the right from the polysilicon gate structure 21 by the photoresist 22 which covers the part of the substrate 20, just to the right of gate structure 21. The chemical species of the dopant implanted is arsenic (As) with a dose of between about 5E14 cm$^{-2}$ and about 5E16 cm$^{-2}$, and an energy of between about 40 keV and about 100 keV in a tool such as a high current implanter. At the end of the ion implantation, the resist is removed by means of a process such as a plasma O$_2$ resist strip and an H$_2$O$_2$/H$_2$SO$_4$ resist removal.

Figure 4:
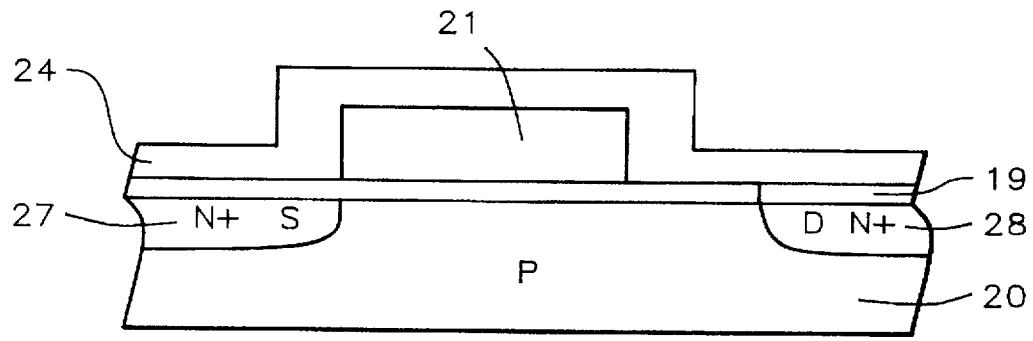

In FIG. 4, on top of the device of FIG. 3, a deposit 24 composed of SiO$_2$ is formed coating the gate structure 21 and the exposed surface of the gate oxide 19. The deposit 24 is deposited in a process reactor to a thickness of between about 1kÅ and about 4kÅ by CVD (Chemical Vapor Deposition.) Alternatively, the CVD SiO$_2$ can be an APCVD (Atmospheric Pressure CVD) or PECVD (Plasma Enhanced CVD.)

Figure 5:
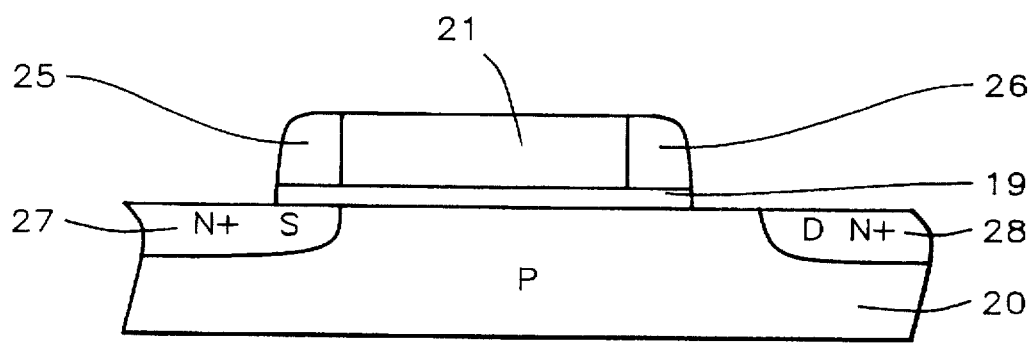

Then, as shown in FIG. 5, the CVD deposit 24 is etched forming the spacers 25 and 26 adjacent to the polysilicon gate. Except for the spacers 25 and 26, all of the CVD deposit 24 has been etched away, by an anisotropic etching process, removing most of the layer 24, but leaving the sidewall spacers 25 and 26 at the edge of the poly without using a mask. The CVD deposit 24 and the portions of the gate oxide 19 beneath the portions of layer 24 removed are both etched by RIE (reactive ion etching.) The gate oxide removed forms a gate oxide structure extending laterally as far as the spacers 24 and 25 from the gate structure 21.

Figure 6:
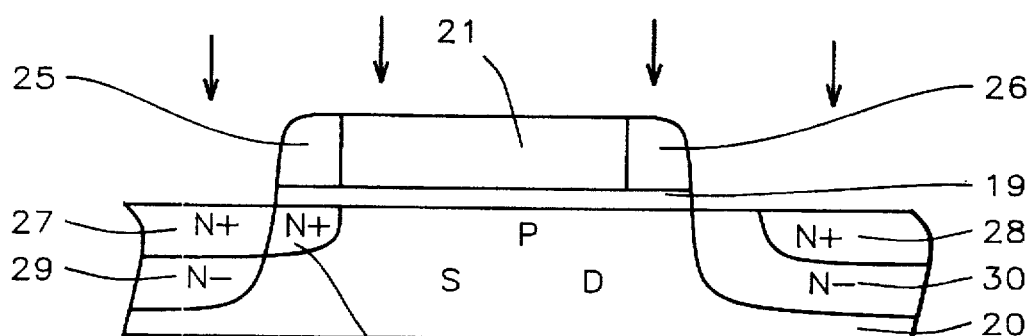

In FIG. 6, a second ion implant of N- ions is deposited into substrate 20 in the outer portion of source region 27 where the spacer 25 does not provide a shield. Thus, the region 29 below the region 27 to the left of spacer 25 is doped N-. The chemical species of the dopant implanted is phosphorous P11 with a dose of between about 5×E12 cm$^{-2}$ and about 5×E14 cm$^{-2}$, at an energy of between about 40 keV and about 80 keV in a medium current implanter tool. The region is already doped N+ so addition of N- dopant adds more N dopant to the N+ region 27.

In the drain region in the substrate 20, the N- implant is strong between the region 28 and the edge of the spacer 26, so that the N+ region 28 is separated from the gate structure 21 by the width of the spacer and the additional N- region 30 which extends to the left and below the N+ region 28 providing a drain off-set by the width of the region 30 at the surface of the substrate 20 and the edge of gate oxide structure 19.

Subsequently, SiO$_2$ is deposited by CVD for the purpose of forming the spacers 25 and 26. The SiO$_2$ is deposited to a thickness of between about 1000 Å and about 4000 Å by CVD (chemical vapor deposition.) The CVD SiO$_2$ can be an APCVD (Atmospheric Pressure CVD) or PECVD (Plasma Enhanced CVD.)

The reactant gases can be as follows:

SiH$_4$ and O$_2$→SiO$_2$ and 2H$_2$ or

TEOS Si(OC$_2$H$_5$)$_4$→SiO$_2$ plus byproducts at a temperature between about 350° C. and about 450° C. or organic or organosilicon compounds at a temperature between about 600° C. and about 800° C.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. An SRAM formed on a semiconductor substrate having a pull-down transistor, the pull-down transistor comprising:

a) a gate oxide structure formed on a top surface of said semiconductor substrate, said gate oxide structure having a top surface;

b) a gate structure and first and second spacer structures formed on said top surface of said gate oxide structure, said first and second spacer structures formed along edges of said gate structure;

c) a source region comprising an N+ region doped with a first dopant and extending beneath said first spacer structure and said gate oxide structure, said source region further comprising an N- region doped with a second dopant extending beneath said N+ region; and d) an offset drain region comprising an N+ region doped with said first dopant formed in said substrate and spaced away from said gate structure and spaced away from said second spacer structure and an N- region doped with a second dopant formed between said second spacer structure and said N+ region, wherein an edge of the source region is aligned with one edge of said gate electrode and an edge of the drain region is aligned with an outer edge of said one of said spacers so that a portion of a channel of said pull down transistor is not covered by said gate structure adjacent said drain.

2. The device of claim 1 wherein said first dopant is an N+ dopant composed of arsenic and said second dopant is an N- dopant composed of phosphorus.

3. The device of claim 2 wherein said first dopant is an N+ dopant of arsenic (As) implanted with a concentration of between about 5×E14 cm$^{-2}$ and about 6×E16 cm$^{-2}$.

4. The device of claim 3 wherein said second dopant is an N- dopant of phosphorus implanted at between about 40 keV and about 80 keV, with a concentration of between about 5×E12 cm$^{-2}$ and about 5×E14 cm$^{-2}$.

5. The device of claim 1 wherein said first dopant is N+ and said second dopant is N-, said first dopant is an N+ dopant of arsenic (As) implanted at between about 40 keV and about 100 keV, with a concentration of between about 5×E14 cm$^{-2}$ and about 6×E16 cm$^{-2}$, and said second dopant is an N- dopant of phosphorus implanted at between about 40 keV and about 80 keV, with a concentration of between about 5×E12 cm$^{-2}$ and about 5×E14 cm$^{-2}$.

6. The device of claim 1 wherein the chemical species of said second dopant is phosphorous (P), implanted at an energy of between about 40 keV and about 80 keV, with a concentration of between about 5×E12 cm$^{-2}$ and about 5×E14 cm$^{-2}$.

7. The device of claim 3 wherein said second dopant is ion implanted into the outer portion of source and drain regions where said spacer does not provide a shield.

8. The device of claim 2 wherein said second dopant comprises phosphorus.

9. The device of claim 8 wherein the chemical species of said second dopant ion implanted at an energy between about 40 keV and about 80 keV, with a concentration of between about 5×E12 cm$^{-2}$ and about 5×E14 cm$^{-2}$.

10. The device of claim 9 wherein a silicon oxide spacer was formed before implantation of said second dopant.

11. An SRAM formed on a P-type semiconductor substrate having pull-down transistors each having a source region, a drain region, a gate oxide structure and a doped polysilicon gate structure with spacers formed adjacent edges thereof, wherein said gate oxide structure is formed on a surface of said semiconductor substrate, said gate oxide layer having a surface, said gate structure and said spacer structures formed on said surface of said gate oxide structure, said spacers formed along said edges of said gate structure, said source region including an N+ doped source region, said drain region including an N+ doped drain region and an N− doped drain region, said N+ source region and said N+ drain region having a first dopant, said N+ source region extending beneath a first of said spacer structures and said gate oxide structure aligned with an edge of said gate electrode, and said N+ drain region being offset from a second of said spacer structures, and said N− doped drain region having a second dopant and offset from said gate electrode so that a region of said P-type semiconductor substrate is disposed between said gate electrode and said drain region.

* * * * *